United States Patent
Yang et al.

(10) Patent No.: US 7,041,572 B2
(45) Date of Patent: May 9, 2006

(54) FABRICATION METHOD FOR A DEEP TRENCH ISOLATION STRUCTURE OF A HIGH-VOLTAGE DEVICE

(75) Inventors: Jia-Wei Yang, Hsinchu (TW); Chih-Cherng Liao, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 52 days.

(21) Appl. No.: 10/793,773

(22) Filed: Mar. 8, 2004

(65) Prior Publication Data

US 2004/0171220 A1    Sep. 2, 2004

Related U.S. Application Data

(63) Continuation-in-part of application No. 10/354,130, filed on Jan. 30, 2003, now Pat. No. 6,972,471.

(30) Foreign Application Priority Data

Oct. 25, 2002    (TW) .............................. 91125218 A

(51) Int. Cl.
   *H01L 21/76*    (2006.01)
   *H01L 21/336*   (2006.01)

(52) U.S. Cl. ............... 438/424; 438/259; 438/270; 438/271

(58) Field of Classification Search ............... 438/424, 438/259, 270–271, 589, 360, 106, 366, 367, 438/371, 438
   See application file for complete search history.

(56) References Cited

U.S. PATENT DOCUMENTS 5,442,214 A * 8/1995 Yang .......................... 257/328
6,576,516 B1 * 6/2003 Blanchard .................... 438/268

\* cited by examiner

*Primary Examiner*—Chuong Anh Luu
(74) *Attorney, Agent, or Firm*—Birch, Stewart, Kolasch & Birch, LLP

(57) ABSTRACT

A fabrication method for a semiconductor device. On a semiconductor silicon substrate with a first type conductivity, an epitaxial layer with a second type conductivity and an oxide layer on the epitaxial layer are formed with at least a deep trench. Ion implantation is used to form an ion diffusion region with the first type conductivity which is formed in the epitaxial layer and surrounds the sidewall and bottom of the deep trench. An oxide liner is formed on the sidewall and bottom of the deep trench, and then an undoped polysilicon layer is formed to fill the deep trench. The combination of the ion diffusion region and the undoped polysilicon layer serves as a deep trench isolation structure.

21 Claims, 6 Drawing Sheets

FABRICATION METHOD FOR A DEEP TRENCH ISOLATION STRUCTURE OF A HIGH-VOLTAGE DEVICE

This application is a continuation in part of Ser. No. 10/354,130 filed Jan. 30, 2003 now U.S. Pat. No. 6,972,471.

BACKGROUND OF THE INVENTION

1. Field of the Invention

The invention relates to a fabrication method for an isolation structure of a semiconductor device, and more particularly to a fabrication method for a deep trench isolation structure of a high-voltage device.

2. Description of the Related Art

Recently, as the manufacturing techniques of semiconductor integrated circuits develop, the request of highly integrating controllers, memories, low-voltage operating circuits and high-voltage power devices on a single chip increases to achieve a single-chip system, in which the power device including vertical double-diffused transistor (VDMOS), lateral double-diffused transistor (LDMOS) and insulated gate bipolar transistor (IGBT), is used to increase power transform efficiency and decrease energy wastage. Since the high-voltage transistor and the low-voltage CMOS circuit device are provided on the single chip, an isolation structure is required to isolate the high-voltage device and the low-voltage device. Also, in order to fit in with a high breakdown voltage that is requested by the high-voltage device, the isolation structure must reach predetermined-depth isolation. Therefore, a deep trench isolation structure formed in a thick epitaxial layer has been developed by extra providing an epitaxial layer on a semiconductor substrate.

FIG. 1 is a cross-section of a conventional isolation structure of a high-voltage device. In a case of a P-type semiconductor silicon substrate 10, an N-type epitaxial layer 12 is provided on the P-type semiconductor silicon substrate 10, and an N-type buried layer (NBL) 14 is embedded between the N-type epitaxial layer 12 and the P-type semiconductor silicon substrate 10. Also, two $P^+$-type deep trench isolation structures 16 are formed in the N-type epitaxial layer 12 to define a high-voltage area, and a plurality of field oxidation (FOX) regions 18 are formed on the upper surface of the N-type epitaxial layer 12 to isolate components within the high-voltage area. An $N^+$-type sinker 20 is formed in the N-type epitaxial layer 12 between the first FOX region 18I and the second FOX region 18II, and electrically connected to exterior wires formed overlying the N-type epitaxial layer 12. Moreover, a P-type body 22 is formed in the N-type epitaxial layer 12 between the second FOX region 18II and the third FOX region 18III, and a pair of $N^+$-type diffusion regions 24 and a pair of $P^+$-type diffusion regions 26 that are respectively electrically connected to exterior wires are formed in the P-type body 22. Furthermore, a gate structure 28 is formed on the surface of the P-type body 22.

In manufacturing the $P^+$-type deep trench isolation structure 16, a deep trench formed in the N-type epitaxial layer 12 is filled with an oxide layer, and then ion implantation is employed to implant $B^+$ ions into the oxide layer by, and finally thermal annealing is employed to diffuse the $B^+$ ions in the oxide layer. For spreading the $B^+$ ions around within the deep trench, however, the procedure time of the thermal annealing is very long, resulting in increased thermal budget. Also, since the thermal annealing makes the $B^+$ ions diffuse both toward a vertical direction and a lateral direction, the width W of the $P^+$-type deep trench isolation structure 16 increases as the depth H of the $P^+$-type deep trench isolation structure 16 increases. When the deep trench 16 is requested to reach predetermined-depth isolation, the lateral size of the $P^+$-type deep trench isolation structure is also increases, resulting in the required size of a chip being increased.

Accordingly, how to forming a deep trench isolation structure with decreasing thermal budget and reducing the lateral size of the deep trench isolation structure to solve the problems caused by the prior method is called for.

SUMMARY OF THE INVENTION

Accordingly, an object of the invention is to provide a fabrication method for a deep trench isolation structure of a high-voltage device, in which a $P^+$-type diffusion region and an undoped polysilicon layer within a deep trench are formed as a $P^+$-type deep trench isolation structure.

To achieve these and other advantages, the invention provides a fabrication method for a deep trench isolation structure of a high-voltage device. First, a semiconductor silicon substrate with a first type conductivity is provided with an epitaxial layer with a second type conductivity. Then, an oxide layer is formed on the epitaxial layer. Next, photolithography and etching are used to form a deep trench which passes through the oxide layer and the epitaxial layer. Next, an oxide liner is formed on the sidewall and bottom of the deep trench. Next, ion implantation is used to form an ion diffusion region with the first type conductivity which is formed in the epitaxial layer and surrounds the sidewall and bottom of the deep trench. Next, an undoped polysilicon layer is formed on the entire surface of the semiconductor silicon substrate to fill the deep trench. Finally, the oxide layer and the undoped polysilicon layer outside the deep trench are removed until the surface of the undoped polysilicon layer is leveled with the surface of the epitaxial layer.

DESCRIPTION OF THE DRAWINGS

For a better understanding of the present invention, reference is made to a detailed description to be read in conjunction with the accompanying drawings, in which.

DETAILED DESCRIPTION OF THE INVENTION

A preferred embodiment of the present invention is now described with reference to FIGS. 2A through 2G, in which a P-type semiconductor substrate is provided to form a $P^+$-type deep trench isolation structure within a high-voltage device area. In another case, the present invention can apply to the formation of an $N^+$-type deep trench isolation structure.

Figure 1:
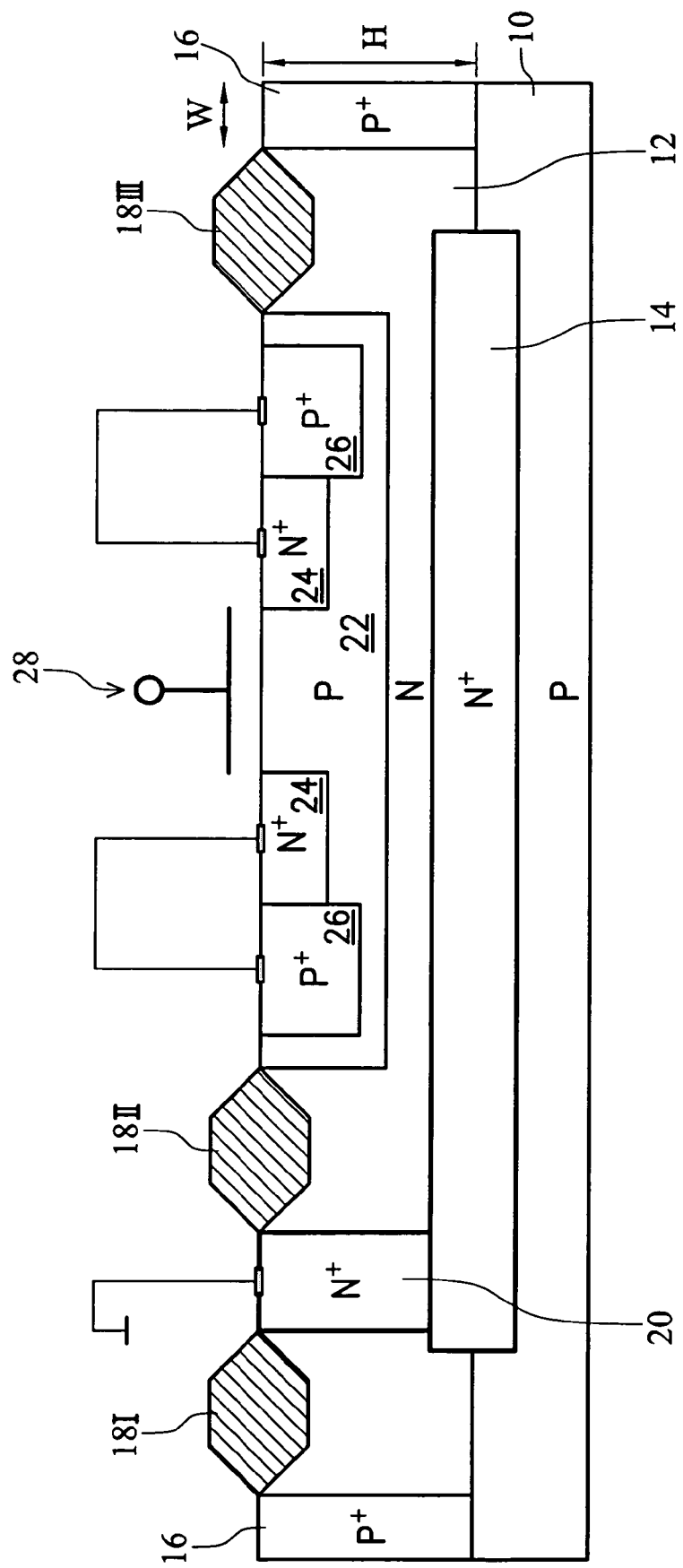
FIG. 1 is a cross-section of a conventional isolation structure of a high-voltage device.
Figure 2A:
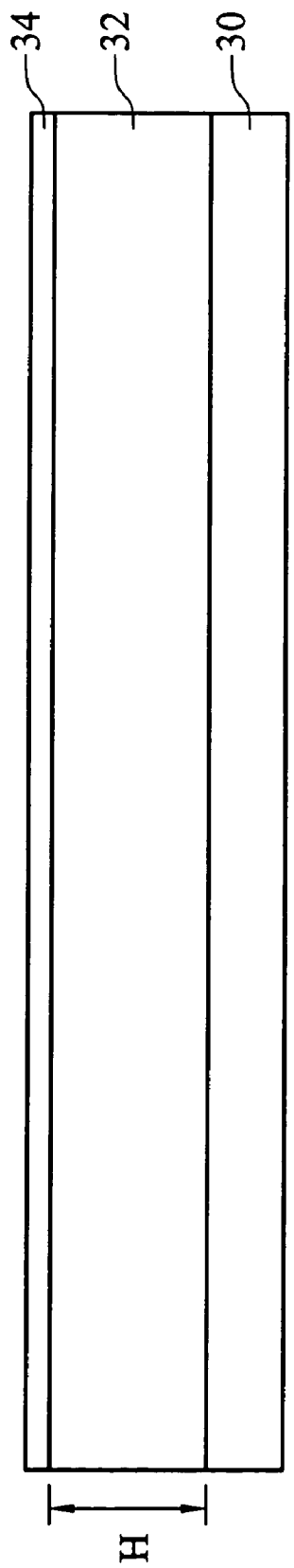
FIGS. 2A to 2G are cross-sections of a method of forming a deep trench isolation structure of a high-voltage device according the present invention.
Figure 2B:
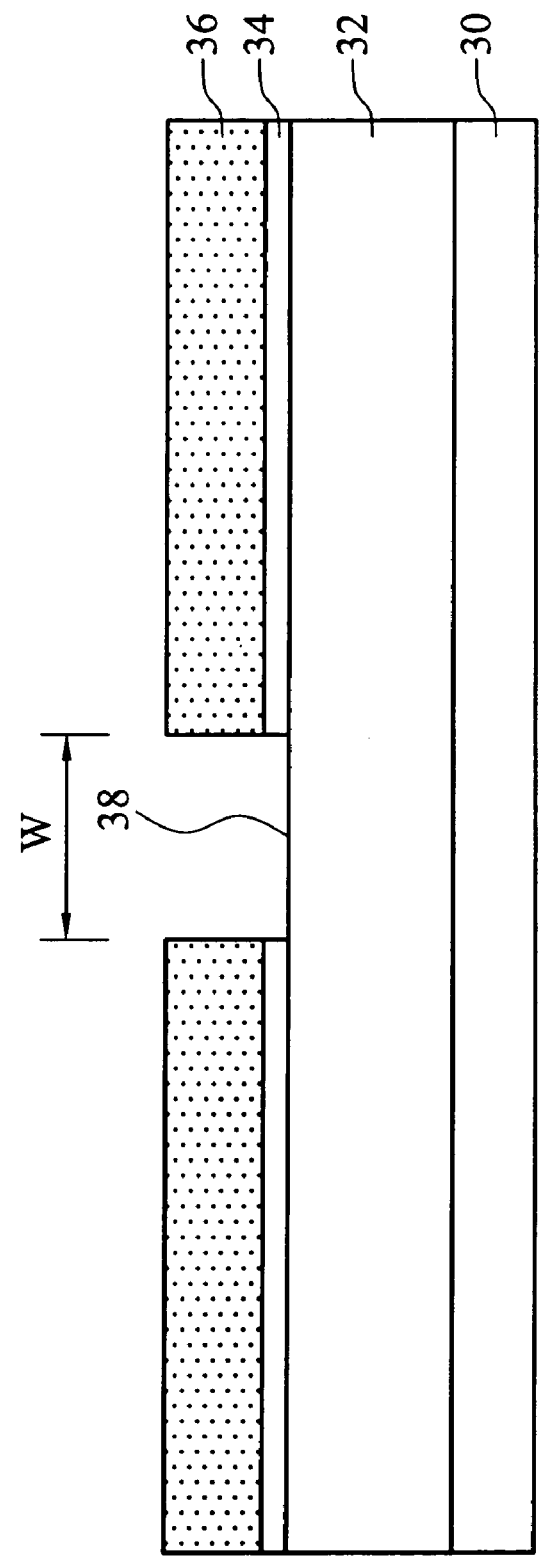

FIGS. 2A to 2G are cross-sections of a method of forming a deep trench isolation structure of a high-voltage device according the present invention. In FIG. 2A, an N-type epitaxial layer 32 is formed on a P-type semiconductor silicon substrate 30, and an oxide layer 34 is formed on the N-type epitaxial layer 32. Preferably, the thickness of the N-type epitaxial layer 32 is approximately equal to the predetermined depth H of the deep trench isolation structure. In addition, for product demands, an N-type buried layer (NBL) may be formed between the N-type epitaxial layer 32 and the P-type semiconductor silicon substrate 30. Then, in FIG. 2B, a photoresist layer 36 having a deep trench pattern is formed on the oxide layer 34 to define the width W of the deep trench isolation structure. Next, using the photoresist layer 36 as a mask, the exposed area of the oxide layer 34 is etched to form an opening 38.

Figure 2C:
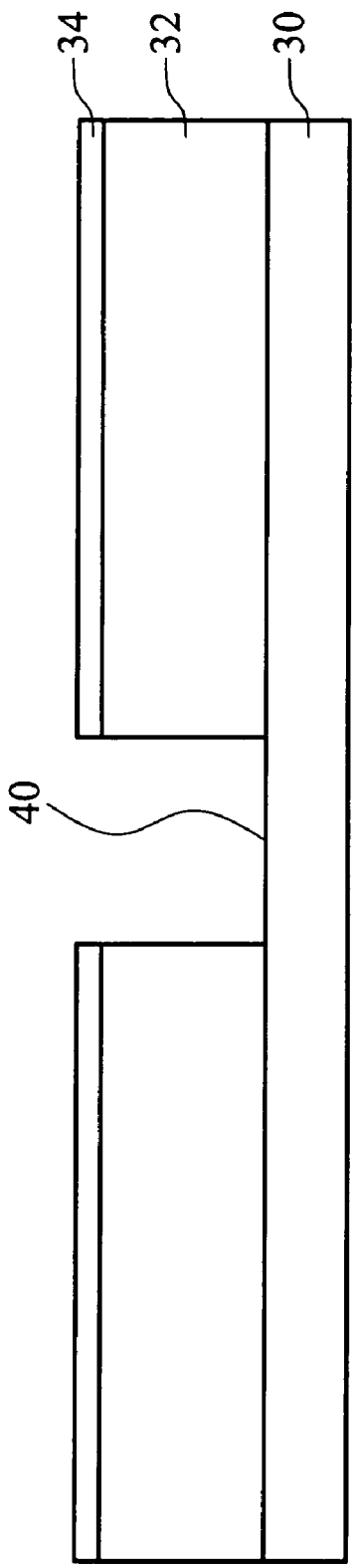
Figure 2D:
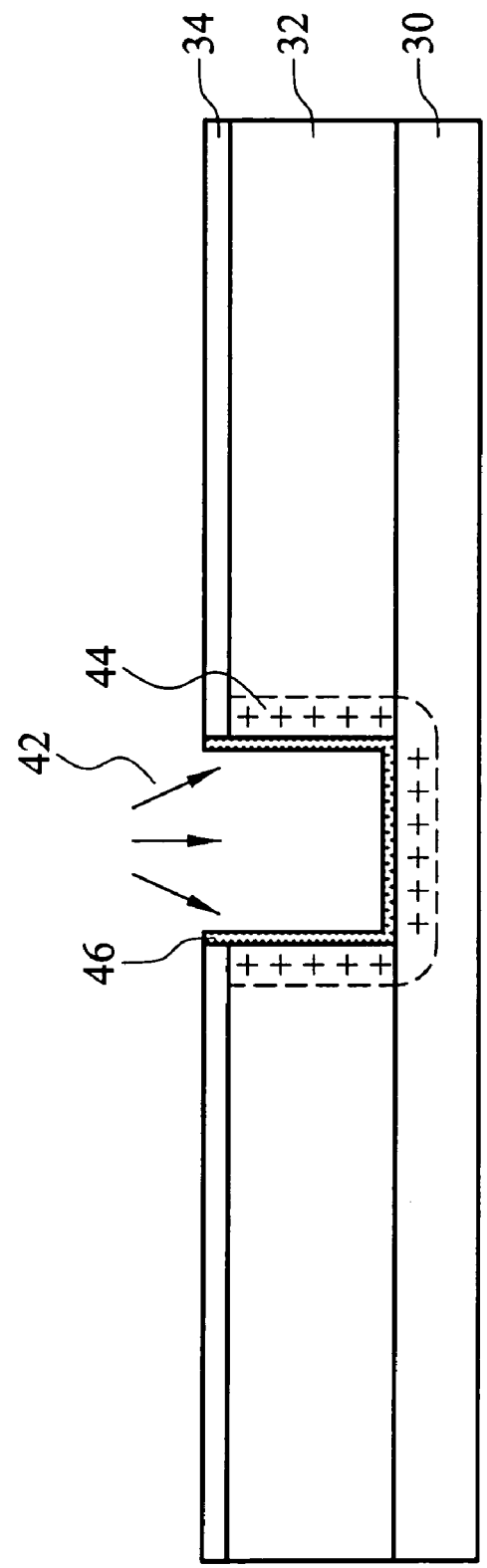

Next, in FIG. 2C, using the oxide layer 34 as a mask, the exposed area of the N-type epitaxial layer 32 under the opening 38 is etched until the surface of the P-type semiconductor silicon substrate 30 is exposed, thus a deep trench 40 is formed. Next, in FIG. 2D, using an ion implantation 42 with P$^+$-type dopants, such as a tilt-angle ion implantation with B$^+$ ions, a P$^+$-type diffusion region 44 is formed in the sidewall and bottom of the deep trench 40. Then, an oxide liner 46 is formed on the sidewall and bottom of the deep trench 40 to repair the damaged surface caused by the ion implantation 42.

Figure 2E:
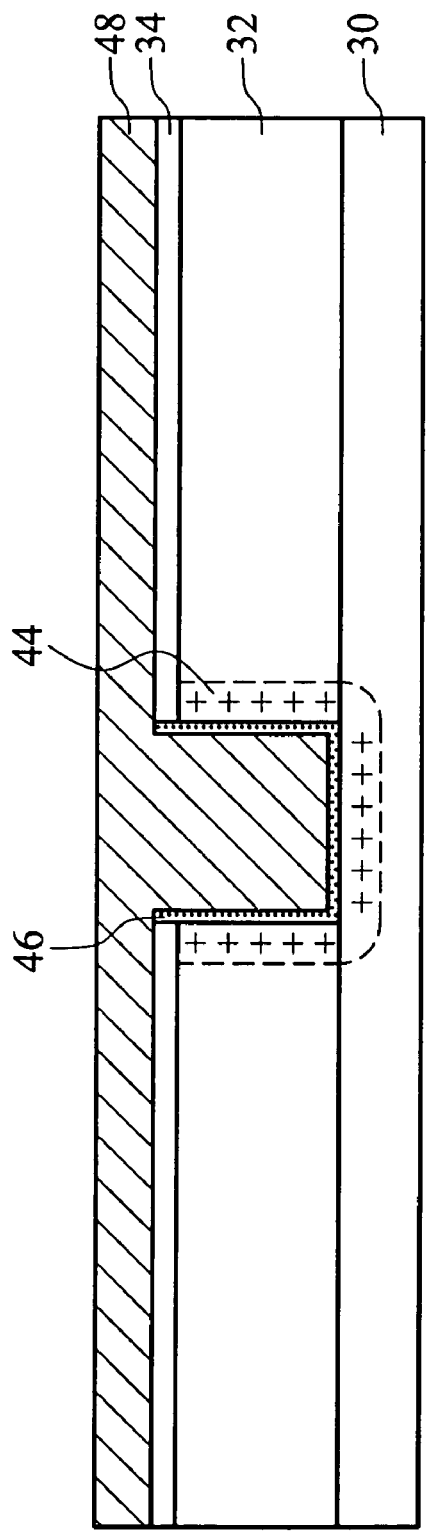
Figure 2F:
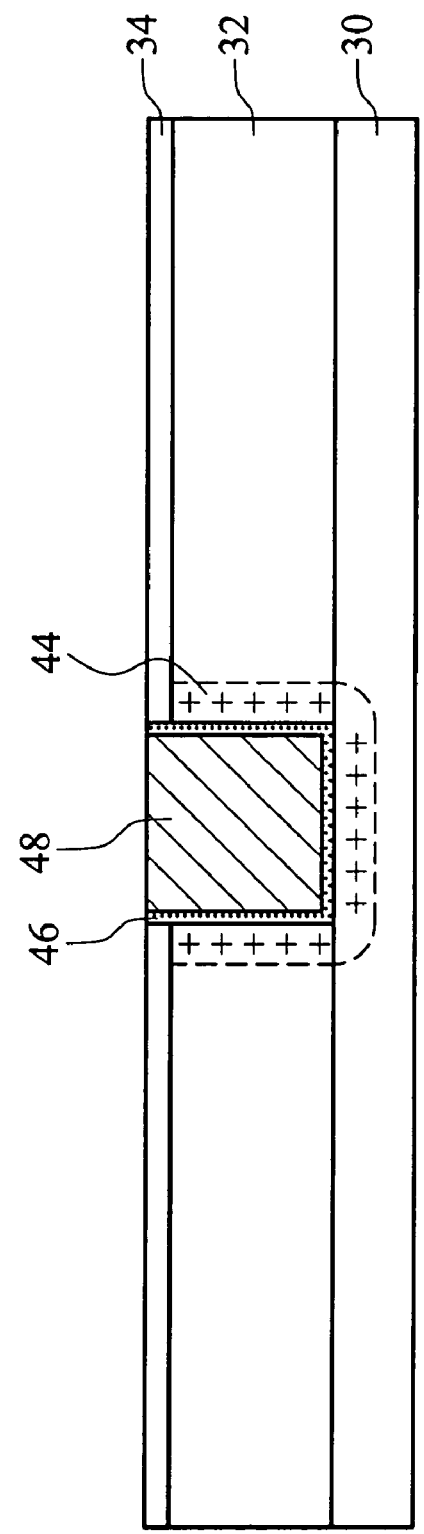
Figure 2G:
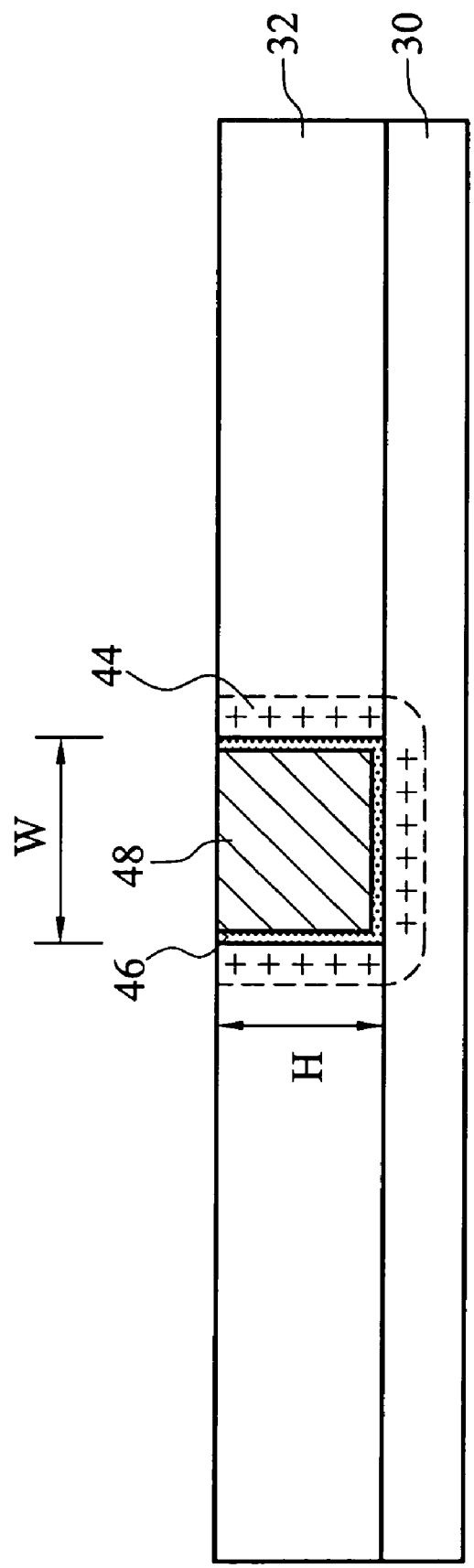

Thereafter, in FIG. 2E, an undoped polysilicon layer 48 is deposited on the entire surface of the P-type semiconductor silicon substrate 30 to fill the deep trench 40. Then, the thermal annealing is used to reduce the grain size of the undoped polysilicon layer 48 to prevent the deep trench 40 being partially filled with the undoped polysilicon layer 48 from voids formed in the undoped polysilicon layer 48. Next, in FIG. 2F, using an etching back process, the undoped polysilicon layer 48 outside the deep trench 40 is removed until the surface of the oxide layer 34 is exposed. Finally, in FIG. 2G, using chemical mechanical polishing (CMP), the oxide layer 34 and a part of the undoped polysilicon layer 48 are removed until the surface of the N-type epitaxial layer 32 is exposed. Then, the thermal annealing is used to re-grow grains of the undoped polysilicon layer 48. This completes P$^+$-type deep trench isolation structure.

The present invention provides the P$^+$-type diffusion region 44 and the undoped polysilicon layer 48 within the deep trench 40 as the P$^+$-type deep trench isolation structure. Since the P$^+$-type diffusion region 44 is formed on the sidewall and bottom of the deep trench 40 by the ion implantation 42, it is unnecessary to use the thermal annealing to drive the vertical diffusion mechanism of the P$^+$-type dopants, resulting in decreased thermal budget. Also, compared with the conventional deep trench isolation structure having an H/W ratio equal to 1.2 by using thermal annealing, the present invention can control the H/W ratio of the P$^+$-type deep trench isolation structure at 4~3. This can reduce the surface size of the P$^+$-type deep trench isolation structure.

Figure 3:
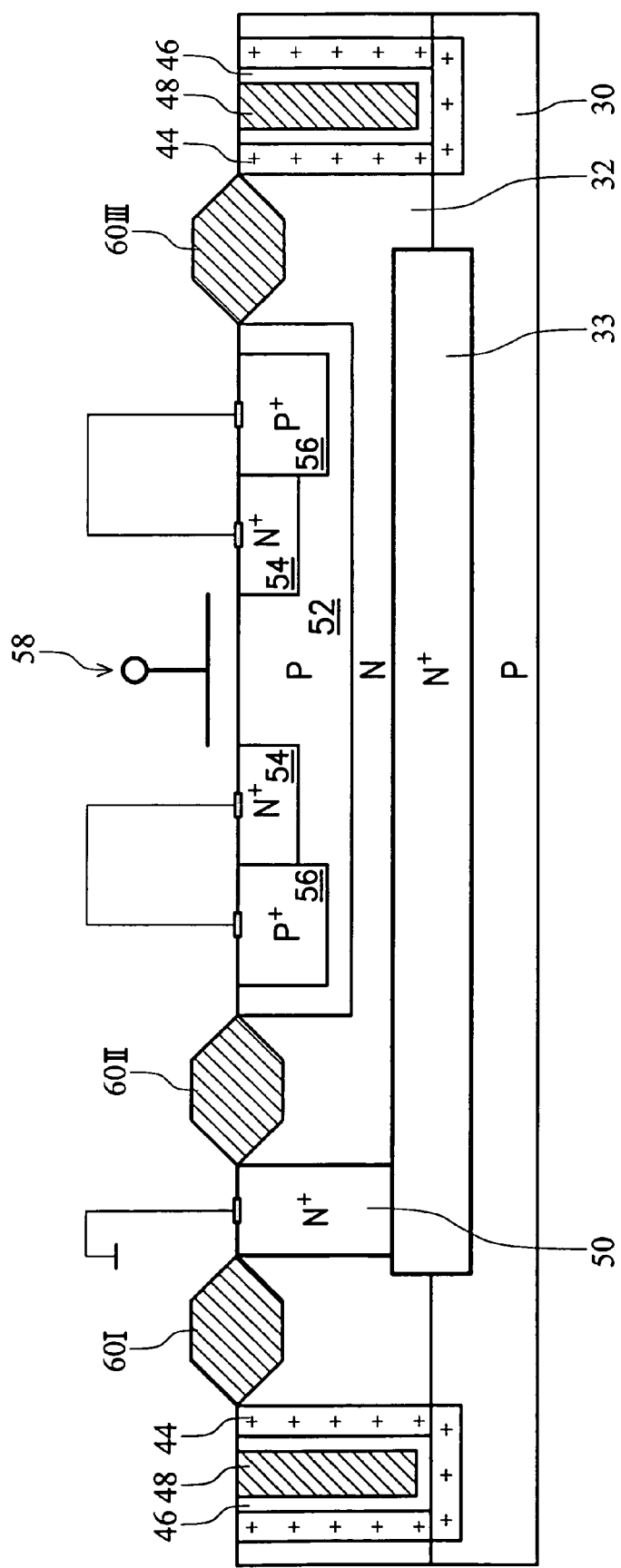
FIG. 3 is a cross-section of a high-voltage device with $P^+$-type deep trench isolation structures according to the present invention.

The above-described fabrication method for the P$^+$-type deep trench isolation structure, including the P$^+$-type diffusion region 44 and the undoped polysilicon layer 48 within the deep trench 40, can be integrated into a high-voltage device process. Preferably, the high-voltage device has a drain terminal with a supply voltage exceeding 5V. FIG. 3 is a cross-section of a high-voltage device with P$^+$-type deep trench isolation structures according to the present invention. Elements in FIG. 3 are substantially similar to those in FIGS. 2A~2G, with the similar portions omitted herein. In the P-type semiconductor silicon substrate 30, an N-type buried layer (NBL) 33 is embedded between the N-type epitaxial layer 32 and the P-type semiconductor silicon substrate 30. Also, two P$^+$-type deep trench isolation structures, including the P$^+$-type diffusion region 44 and the undoped polysilicon layer 48, are formed in the N-type epitaxial layer 32 to define a high-voltage area, and field oxidation (FOX) regions 60I, 60II and 60II are formed on the upper surface of the N-type epitaxial layer 32 to isolate components within the high-voltage area. An N$^+$-type sinker 50 is formed in the N-type epitaxial layer 32 between the first FOX region 60I and the second FOX region 60II, and electrically connected to exterior wires formed overlying the N-type epitaxial layer 32. Moreover, a P-type body 52 is formed in the N-type epitaxial layer 32 between the second FOX region 60II and the third FOX region 60III, and a pair of N$^+$-type diffusion regions 54 and a pair of P$^+$-type diffusion regions 56 that are respectively electrically connected to exterior wires are formed overlying the P-type body 52. Furthermore, a gate structure 58 is formed overlying the P-type body 52.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for a semiconductor device, comprising the steps of:
    providing a semiconductor silicon substrate with a first type conductivity;
    forming an epitaxial layer with a second type conductivity overlying the semiconductor silicon substrate;
    forming an oxide layer overlying the epitaxial layer;
    forming at least one deep trench which passes through the oxide layer and the epitaxial layer;
    forming an ion diffusion region with the first type conductivity in the epitaxial layer, wherein the ion diffusion region surrounds the sidewall and bottom of the deep trench;
    forming an oxide liner on the sidewall and bottom of the deep trench; and
    forming an undoped polysilicon layer in the deep trench;
    wherein, the combination of the ion diffusion region and the undoped polysilicon layer within the deep trench serves as a deep trench isolation structure.

2. The fabrication method for a semiconductor device as claimed in claim 1, wherein the first type conductivity is P-type, and the second type conductivity is N-type.

3. The fabrication method for a semiconductor device as claimed in claim 2, wherein the ion diffusion region is a P$^+$-type ion diffusion region.

4. The fabrication method for a semiconductor device as claimed in claim 1, wherein the first type conductivity is N-type, and the second type conductivity is P-type.

5. The fabrication method for a semiconductor device as claimed in claim 4, wherein the ion diffusion region is an N$^+$-type ion diffusion region.

6. The fabrication method for a semiconductor device as claimed in claim 1, wherein the step of forming the deep trench comprises:
    forming a photoresist layer with a deep trench pattern overlying the oxide layer;
    etching the oxide layer with the photoresist layer as a mask to form an opening;
    removing the photoresist layer; and
    using the oxide layer as a mask to etching the epitaxial layer under the opening until the semiconductor silicon substrate is exposed, where the deep trench is formed to pass through the epitaxial layer and expose the semiconductor silicon substrate.

7. The fabrication method for a semiconductor device as claimed in claim 1, wherein the step of forming the undoped polysilicon layer comprises:
   forming an undoped polysilicon layer overlying the semiconductor silicon substrate to fill the deep trench; and
   removing the oxide layer and the undoped polysilicon layer outside the deep trench until the surface of the undoped polysilicon layer is leveled with the surface of the epitaxial layer.

8. The fabrication method for a semiconductor device as claimed in claim 7, wherein the step of leveling off the surfaces of the undoped polysilicon layer and the epitaxial layer comprises:
   using an etching back process to remove the undoped polysilicon layer outside the deep trench;
   using chemical mechanical polishing to remove the oxide layer and a part of the undoped polysilicon layer until the epitaxial layer is exposed; and
   using thermal annealing on the surface of the undoped polysilicon layer.

9. The fabrication method for a semiconductor device as claimed in claim 1, wherein two deep trenches are formed to pass through the oxide layer and the epitaxial layer, and thereby two deep trench isolation structures are formed in the two deep trenches to define a high-voltage area of the semiconductor silicon substrate.

10. The fabrication method for a semiconductor device as claimed in claim 9, wherein the high-voltage area of the semiconductor silicon substrate comprises:
    a buried layer with the second type conductivity formed between the epitaxial layer and the semiconductor silicon substrate;
    a plurality of field oxidation regions formed in the epitaxial layer, wherein a first field oxidation region, a second field oxidation region and a third field oxidation region are successively arranged between the two deep trench isolation structures;
    a sinker with the second type conductivity formed in the epitaxial layer between the first field oxidation region and the second field oxidation region;
    a body with the first type conductivity formed in the epitaxial layer between the second field oxidation region and the third field oxidation region;
    a gate structure formed overlying the body;
    a pair of first diffusion regions with the second type conductivity formed in the body and laterally adjacent to the gate structure; and
    a pair of second diffusion regions with the first type conductivity formed in the body and laterally adjacent to the first diffusion regions, respectively.

11. The fabrication method for a semiconductor device as claimed in claim 10, wherein:
    the buried layer is an $N^+$-type ion diffusion region;
    the sinker is an $N^+$-type ion diffusion region;
    the body is a P-type body;
    the first diffusion region is an $N^+$-type ion diffusion region; and
    the second diffusion region is a $P^+$-type ion diffusion region.

12. A fabrication method for a high-voltage device, comprising the steps of:
    providing a semiconductor silicon substrate with a first type conductivity;
    forming an epitaxial layer with a second type conductivity overlying the semiconductor silicon substrate;
    forming an oxide layer overlying the epitaxial layer;
    forming at least two deep trenches which pass through the oxide layer and the epitaxial layer, wherein the two deep trenches define a high-voltage area;
    forming an ion diffusion region with the first type conductivity in the epitaxial layer, wherein the ion diffusion region surrounds the sidewall and bottom of each deep trench;
    forming an oxide liner on the sidewall and bottom of each deep trench; and
    forming an undoped polysilicon layer in each deep trench;
    wherein, the combination of the ion diffusion region and the undoped polysilicon layer within each deep trench serves as a deep trench isolation structure.

13. The fabrication method for a high-voltage device as claimed in claim 12, wherein the first type conductivity is P-type, and the second type conductivity is N-type.

14. The fabrication method for a high-voltage device as claimed in claim 13, wherein the ion diffusion region is a $P^+$-type ion diffusion region.

15. The fabrication method for a high-voltage device as claimed in claim 12, wherein the first type conductivity is N-type, and the second type conductivity is P-type.

16. The fabrication method for a high-voltage device as claimed in claim 15, wherein the ion diffusion region is an $N^+$-type ion diffusion region.

17. The fabrication method for a high-voltage device as claimed in claim 12, wherein the step of forming each deep trench comprises:
    forming a photoresist layer with a deep trench pattern overlying the oxide layer;
    etching the oxide layer with the photoresist layer as a mask to form an opening;
    removing the photoresist layer; and
    using the oxide layer as a mask to etching the epitaxial layer under the opening until the semiconductor silicon substrate is exposed, where the deep trench is formed to pass through the epitaxial layer and expose the semiconductor silicon substrate.

18. The fabrication method for a high-voltage device as claimed in claim 12, wherein the step of forming the undoped polysilicon layer comprises:
    forming an undoped polysilicon layer overlying the semiconductor silicon substrate to fill the deep trench; and
    removing the oxide layer and the undoped polysilicon layer outside the deep trench until the surface of the undoped polysilicon layer is leveled with the surface of the epitaxial layer.

19. The fabrication method for a high-voltage device as claimed in claim 18, wherein the step of leveling off the surfaces of the undoped polysilicon layer and the epitaxial layer comprises:
    using an etching back process to remove the undoped polysilicon layer outside the deep trench;
    using chemical mechanical polishing to remove the oxide layer and a part of the undoped polysilicon layer until the epitaxial layer is exposed; and
    using thermal annealing on the surface of the undoped polysilicon layer.

20. The fabrication method for a high-voltage device as claimed in claim 12, wherein the high-voltage area comprises:
    a buried layer with the second type conductivity formed between the epitaxial layer and the semiconductor silicon substrate;
    a plurality of field oxidation regions formed in the epitaxial layer, wherein a first field oxidation region, a second field oxidation region and a third field oxidation region are successively arranged between the two deep trench isolation structures;

a sinker with the second type conductivity formed in the epitaxial layer between the first field oxidation region and the second field oxidation region;

a body with the first type conductivity formed in the epitaxial layer between the second field oxidation region and the third field oxidation region;

a gate structure formed overlying the body;

a pair of first diffusion regions with the second type conductivity formed in the body and laterally adjacent to the gate structure; and a pair of second diffusion regions with the first type conductivity formed in the body and laterally adjacent to the first diffusion regions, respectively.

21. The fabrication method for a high-voltage device as claimed in claim 20, wherein:

the buried layer is an $N^+$-type ion diffusion region;

the sinker is an $N^+$-type ion diffusion region;

the body is a P-type body;

the first diffusion region is an $N^+$-type ion diffusion region; and the second diffusion region is a $P^+$-type ion diffusion region.

* * * * *